United States Patent
Koevoets et al.

(10) Patent No.: US 9,696,640 B2
(45) Date of Patent: Jul. 4, 2017

(54) LITHOGRAPHIC APPARATUS

(71) Applicant: ASML Netherlands B.V., Veldhoven (NL)

(72) Inventors: Adrianus Hendrik Koevoets, Mierlo (NL); Theodorus Petrus Maria Cadee, Asten (NL); Harmeet Singh, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/399,870

(22) PCT Filed: May 2, 2013

(86) PCT No.: PCT/EP2013/059157
§ 371 (c)(1),
(2) Date: Nov. 7, 2014

(87) PCT Pub. No.: WO2013/167463
PCT Pub. Date: Nov. 14, 2013

(65) Prior Publication Data
US 2015/0098067 A1    Apr. 9, 2015

Related U.S. Application Data

(60) Provisional application No. 61/644,860, filed on May 9, 2012.

(51) Int. Cl.
G03B 27/58    (2006.01)
G03B 27/52    (2006.01)
G03F 7/20     (2006.01)

(52) U.S. Cl.
CPC ...... *G03F 7/70858* (2013.01); *G03F 7/70758* (2013.01)

(58) Field of Classification Search
CPC .................. G03F 7/70758; G03F 7/70858
See application file for complete search history.

(56) References Cited

U.S. PATENT DOCUMENTS

| 5,382,800 A | 1/1995 | Nishino et al. | |
| 7,177,007 B2* | 2/2007 | Emoto ................ | G03F 7/70525 355/30 |
| 2004/0079518 A1* | 4/2004 | del Puerto .......... | G03F 7/70716 165/58 |

(Continued)

FOREIGN PATENT DOCUMENTS

JP    2005-026288    1/2005

OTHER PUBLICATIONS

International Search Report mailed Jul. 30, 2013 in corresponding International Patent Application No. PCT/EP2013/059157.

*Primary Examiner* — Deoram Persaud
(74) *Attorney, Agent, or Firm* — Pillsbury Winthrop Shaw Pittman LLP

(57) ABSTRACT

A lithographic apparatus including a first body including a heat source, a second body and a heater device is presented. The second body has a facing surface facing the first body via a gap between the first and second bodies. The heat source is for providing a heat flux to the second body via the gap. The heater device is attached to the facing surface. The heater device is configured to provide a further heat flux to the second body.

12 Claims, 5 Drawing Sheets

(56) References Cited

U.S. PATENT DOCUMENTS

| | | | |
|---|---|---|---|
| 2005/0040712 A1* | 2/2005 | Hazelton | G03F 7/70758 310/58 |
| 2006/0043311 A1 | 3/2006 | Dean | |
| 2006/0220478 A1 | 10/2006 | Emoto | |
| 2010/0195074 A1* | 8/2010 | Sogard | F24J 2/4625 355/67 |
| 2011/0149263 A1* | 6/2011 | Roux | G05B 19/416 355/72 |
| 2012/0019794 A1* | 1/2012 | Hol | G03F 7/70758 355/67 |

\* cited by examiner

LITHOGRAPHIC APPARATUS

CROSS-REFERENCE TO RELATED APPLICATIONS

This application is the U.S. national phase entry of International Patent Application No. PCT/EP2013/059157, filed May 2, 2013, which claims the benefit of priority from U.S. provisional application 61/644,860, which was filed on May 9, 2012, and which is incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Applying the desired pattern on the substrate with high accuracy may allow smaller features to be patterned, which allows smaller integrated circuits with more functionality. Further, patterning with high accuracy may improve the amount of properly functioning ICs produced per substrate.

To achieve high accuracy patterning, some components in the lithographic apparatus need to have an accurately determined position, size or shape.

For example, known lithographic apparatus comprise movable stage systems to move objects with relatively high speed and accuracy. Examples of these movable stage systems are a movable substrate support configured to support a substrate and a patterning device support configured to support a patterning device.

Actuator systems are used to actuate the movable part of the stage system with respect to another part of the actuator system. In some embodiment the other part may also be a movable part.

For example, in a known movable stage system, in particular a substrate support, the stage comprises a long stroke part and a short stroke part. The long stroke part is arranged on a base frame and configured to movably support the short stroke module. The short stroke part is configured to support a substrate. The short stroke part can be positioned with high accuracy over a relatively small range of movement with respect to the long stroke part. The long stroke part can be moved over a relatively large range of movement with respect to the base frame, but with a relatively low accuracy.

The actuator system may comprise a motor and a mover element movable by the motor. The motor may for example be mounted on the long stroke part and the mover element may be part of the short stroke part. The motor comprises a coil which may heat during use of the motor. The heat generated by the coil may negatively influence the performance a lithographic apparatus, in particular caused by the heat being transferred to the mover element. To decrease the effect of this heat, a coil fluid cooling system is provided, which fluid cooling system is configured to cool the coil using a cooling fluid.

In an implementation, the coil fluid cooling system is an active fluid cooling system which uses a two-temperature mixture to adjust the temperature of the cooling fluid of the fluid cooling system. This allows cooling of the coil. However, the cooling may have some time lag, in particular when there is some distance between the coil and the mixing location of the two-temperature mixture. This results in a relative slow type of control having a low bandwidth.

Other types of components that generate heat may be electrical components such as sensors, and may be optical components that are heated due to exposure to radiation. The heat generated by these components may be transferred to components that change position, size or shape due to an increase in temperature. These changes may deteriorate the accuracy of the lithographic apparatus.

SUMMARY

It is desirable to provide lithographic apparatus having a more efficiently controlled temperature. Furthermore, it is desirable to provide a lithographic apparatus having an improved actuator.

According to an embodiment of the invention, there is provided a lithographic apparatus, comprising a first body having a heat source, a second body and a heater device. The second body has a facing surface facing the first body via a gap between the first and second bodies. The heat source is for providing a heat flux to the second body via the gap. The heater device is attached to the facing surface. The heater device is configured to provide a further heat flux to the second body.

The further heat flux from the heater device is provided directly to the second body, causing the further heat flux to have a large influence on the temperature of the second body. The heat flux from the heat source is provided to the second body via the gap, causing the heat flux to have less influence on the temperature of the second body than the further heat flux from the heater device. Changes in heat flux from the heat source can be compensated by the heater device. Because of the difference in influence on the temperature, a small amount of heat flux from the heater device can compensate a large change in the heat flux from the heat source to make the total amount of heat flux to the second body constant. The result is a lithographic apparatus with an efficiently controlled temperature.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
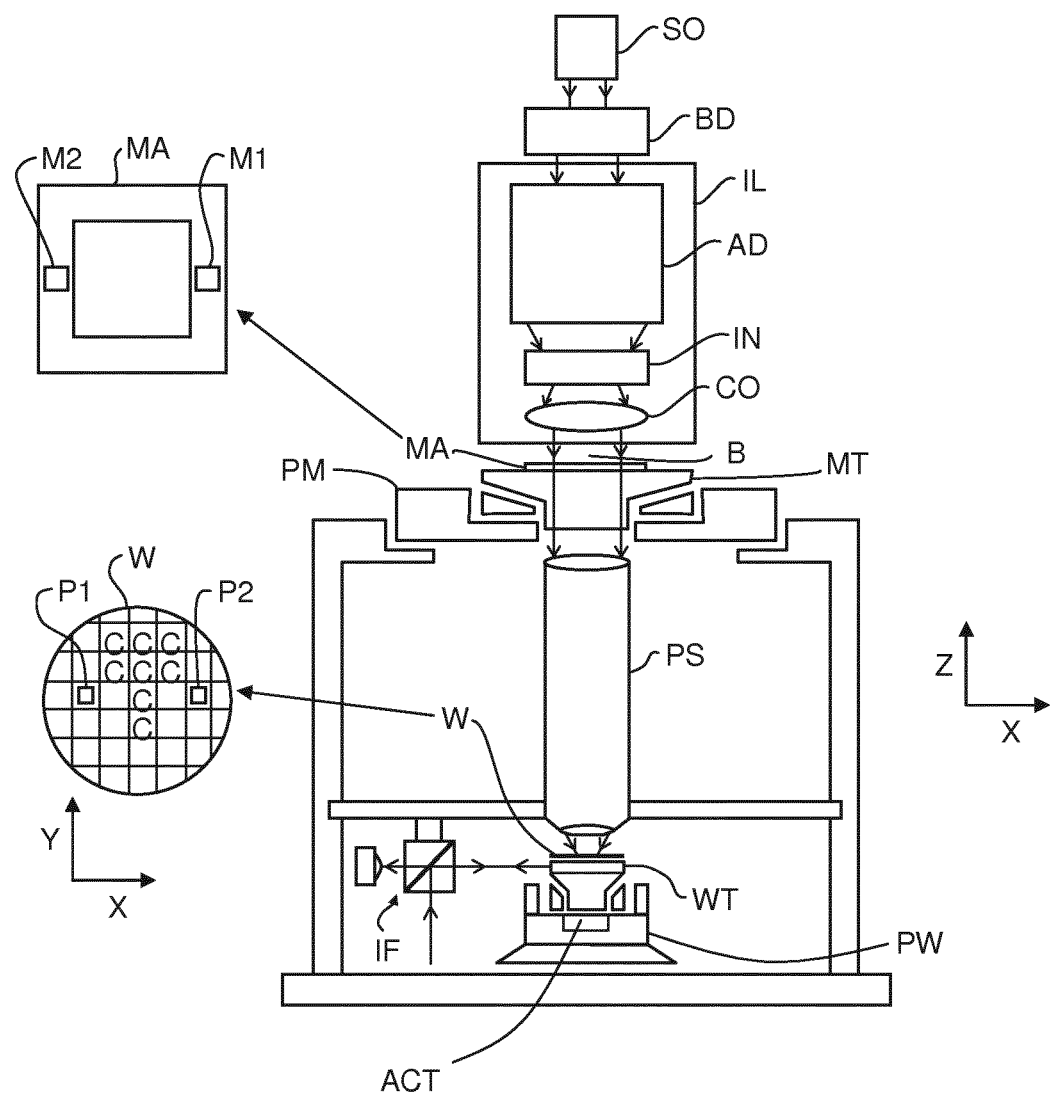
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the second positioning device PW an actuator system ACT is provided for actuation of movements of the substrate table WT. Similar actuator systems may be applied to actuate movement of other movable parts of the lithographic apparatus, in particular the support structure (e.g. mask table) MT.

Figure 2:
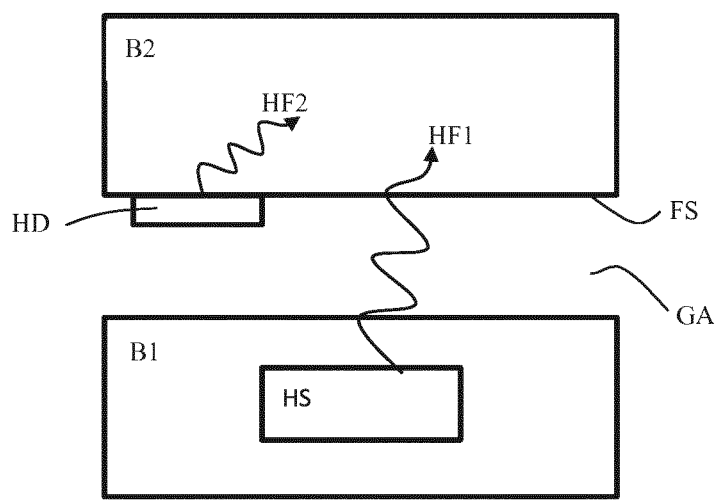
FIG. 2 depicts a second embodiment of the invention.

FIG. 2 depicts an embodiment of the invention. FIG. 2 schematically shows a lithographic apparatus having a first body B1 and a second body B2. The two bodies B1 and B2 are separated from each other by a gap GA. Second body B2 has a surface facing the first body B1. This surface is referred to as facing surface FS. The first body B1 has a heat source HS, which can provide a heat flux HF1 to the second body B2 via the gap GA. A heater device HD is located on the facing surface FS on the second body B2. The heater device HD is arranged to provide a further heat flux HF2 to the second body B2.

In an embodiment, the first body B1 comprises a long-stroke module, the second body B2 comprises a short-stroke module, and the heat source comprises a heat-generating part of the positioning device for moving the short-stroke module relative to the long-stroke module. The first body B1 may comprise the substrate table WT for holding a substrate W, or may comprise the support structure MT for holding the patterning device MA. In an embodiment, the second body B2 is a stationary component. The second body B2 may comprise an optical component, for example an optical component to guide the radiation beam B. The first and the second bodies B1 and B2 may be stationary relative to each other, or may be moveable relative to each other. The first body B1 may comprise any type of body or component of the lithographic apparatus, for example a frame for supporting the projection system or the support structure MT or the substrate table WT. The heat source may comprise electrical components that generate heat, such as sensors, actuators and electrical wires. The heat source may be an area exposed to radiation.

A heater device HD is attached to the facing surface FS of the second body B2. The heater device HD is configured to create a further heat flux HF2. The heat flux HF2 goes to the second body B2.

The amount of heat generated by the heat source may vary over time. For example, when the heat source is part of a motor, more heat may be generated when the motor is working on full power than when the motor is idle. As a result, the heat flux HF1 varies over time, causing the temperature of the second body B2 to change over time. Depending on the material and the shape of the second body B2, the changing temperature causes the second body B2 to change at least one of size, shape and position. The function of the second body B2 may deteriorate due to the change in size, shape or position.

The gap GA may act as a thermal barrier between the first and second bodies B1 and B2. There may be a temperature difference between the first and second bodies B1 and B2. A part of the total heat generated by the heat source HS may not flow to the second body B2 via the heat flux HF1. Instead, the part flows towards another component, or may be removed via a cooling system. The gap GA reduces the influence of the heat source on the temperature of the second body B2 compared to the situation in which the first and second bodies B1 and B2 are in contact with each other.

The heater device HD compensates for the changing heat flux HF1 from the heat source HS. For example, when the heat flux HF1 from the heat source HS decreases, the further heat flux HF2 from the heat device HS increases to keep a constant amount of heat flux to the second body B2. Since the heater device HD is directly connected to the second body B2, a small amount of power may be sufficient to provide a desired amount of further heat flux HF2 to the second body B2. In comparison, for the same amount of heat flux HF1, the power required by the heat source would be bigger, because the heat flux HF1 needs to cross the gap GA to reach the second body B2. So only a small heater device HD may be needed to compensate for changes of a large heat source HS. The amount of power of the heater device HD may be in the range of 1-10% of the amount of power of the heat source HS.

Figure 3:
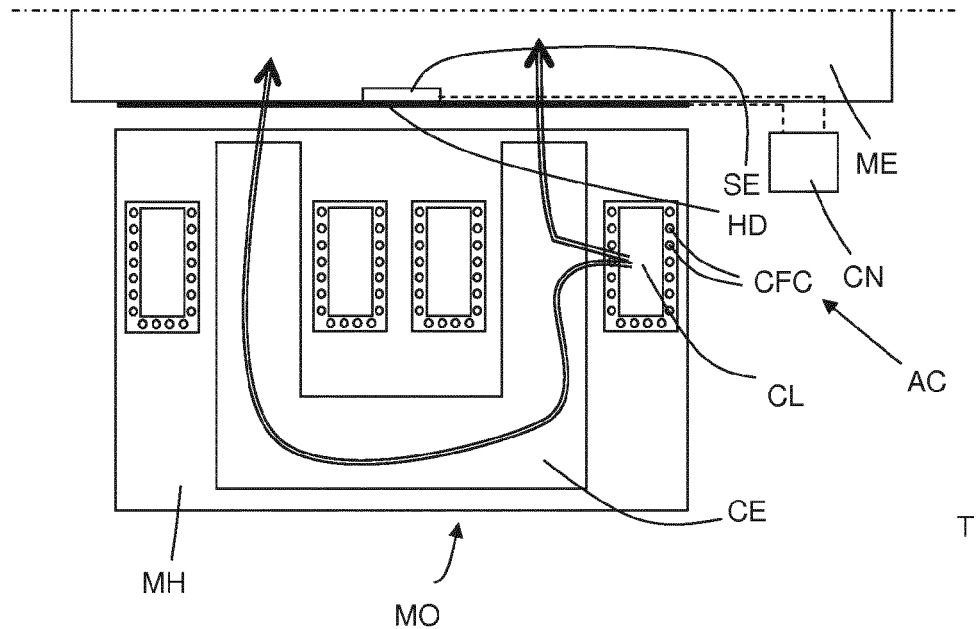
FIG. 3 depicts a side view of an actuator system according to a third embodiment of the invention.

FIG. 3 depicts an actuator system ACT comprising a motor MO and a mover element ME. The motor MO corresponds with the first body B1, and the mover element corresponds to the second body B2 mentioned above. The motor MO is a reluctance motor comprising a motor housing MH accommodating a number of coils CL and a core element CE.

During use of the motor the coil CL may substantially heat. This heat will dissipate. This dissipation of heat may follow one or more paths from the coil CL to the mover element ME via the core element CE. The paths are indicated by heat flux HF1. In this embodiment, the main heat dissipation paths substantially correspond to the magnetic or flux path in the motor MO. These main heat dissipation paths in the drawings are indicated by double-lined arrows. Heat may also dissipate from the coil CL to the mover element ME via other heat dissipation paths, for example directly, not via the core element CE, from the coil CL to the mover element ME. Such other path may for example be ambient air.

To avoid that the heat generated by the coil CL negatively influences the performance of the actuator system, in particular the accuracy of positioning, a coil cooling system CFC is provided. The coil cooling system CFC comprises a number of cooling channels provided around the coil CL. Through these cooling channels cooling fluid can be circulated. The temperature of the cooling fluid may be actively controlled to maintain the coil at a substantially constant temperature. Such active control of the cooling fluid temperature may for example be obtained by a mixing device or a mixer configured to mix upstream of the cooling channels two fluids having different temperatures with a mixing ratio selected to obtain the desired cooling fluid temperature. Although such coil cooling system CFC may provide an effective cooling of the coils for slow changes in the coil temperature, the time lag in the system is relatively large, in particular since the mixing device will be arranged at some distance from the coils.

Relative fast temperature fluctuations in the coil CL may result in heat being dissipated through the actuator system ACT, since the coil cooling system CFC is too slow to directly compensate for these temperature fluctuations.

To improve temperature control in the heat dissipation path from the coil CL to the mover element ME, the actuator system ACT comprises a temperature control system comprising a temperature sensor SE, a temperature controller CN and a heater device or heater HD.

The temperature sensor SE and the heater device HD are arranged on the mover element ME. The temperature controller CN of the temperature control system is configured to provide a temperature control signal on the basis of the temperature measured by the temperature sensor SE. The temperature control signal is aimed at maintaining a substantially constant temperature at the measurement location of the temperature sensor. By maintaining a substantially constant temperature, the heat dissipation of the motor MO to the mover element ME and the heater device HD is substantially at a constant level.

The measurement location of the temperature sensor SE may be arranged close to the heat dissipation paths. For example, the temperature sensor SE may be arranged at a measurement location where the temperature effect of dissipating heat generated by the coil CL can be detected. The temperature sensor SE is configured to measure a temperature at the measurement location. The temperature sensor SE provides a sensor signal representative of the temperature at the measurement location.

The temperature sensor SE may be any temperature sensor suitable to be used to measure the temperature at the measurement location where the temperature sensor SE is arranged. In an embodiment, the temperature sensor SE is a sensor having a relatively low profile, since the temperature sensor SE is placed in the relatively small gap between the motor MO and the mover element ME.

In alternative embodiments, the temperature sensor SE may be arranged in the heat dissipation paths or at another suitable location. Also, two or more temperature sensors may be provided at multiple measurement locations, wherein the temperature is maintained at a substantially constant temperature at each of these measurement locations.

Generally, the position of the one or more measurement locations of one or more temperature sensors is selected such that maintaining the temperature substantially constant at each of the measurement locations results in a constant heat dissipation towards the mover element ME. The constant heat dissipation may also be zero heat dissipation.

The heater device HD may comprise a heater film which is relatively thin and may cover a substantially large area of the facing surface FS. The heater device HD may also be any other suitable heater element.

The sensor signal provided by the temperature sensor SE is introduced into the temperature controller CN. The temperature controller CN is configured to provide a temperature control signal on the basis of the temperature signal. The temperature control signal is guided to the heater device HD. In dependence of this temperature control signal, the heater device HD will provide an amount of heat. The temperature control signal is aimed at maintaining at least at the measurement location of the temperature sensor SE a substantially constant temperature in order to obtain a substantially constant heat dissipation to the mover element. Alternatively or additionally, the heater device HD controlled without using a temperature sensor in a feedforward loop. The feedforward loop may be based on the expected heat flux HF1 from the heat source HS. For example, in case the heat source HS is part of a motor, the heater device HD may be controlled based on a control signal applied to the motor. A control signal causing a large heat flux HF1 may be applied to the heater device HD to cause a small heat flux HF2, and vice versa.

The temperature controller CN may be a separate controller, or be integrated in a central controller, such as a controller of the actuator system or another controller of the lithographic apparatus.

An isolation layer may be arranged in the gap on the motor MO. This isolation layer may provide a weak thermal link between the motor MO and the heater device HD such that the temperature at the measurement location of the temperature sensor SE, can be substantially influenced with a relatively small amount of power. Because of the isolation layer, there is a weak thermal link between the heater device HD and the cooling system CFC. Thus, by using such isolation layer the required power of the heater device HD may be substantially reduced.

Since the temperature control system is aimed at maintaining the temperature at the measurement location at substantially the same level by providing extra heat by a heater device HD, the coil cooling system CFC may be configured to maintain the coil at a coil temperature below the substantially constant temperature maintained at the measurement location. For example, the coil cooling system CFC may be configured to maintain the coil at a coil temperature of 20° C., and the temperature controller CN may be configured to maintain a temperature of 22° C. at the measurement location.

When the coil CL is kept at to the desired coil temperature, the heater device HD will provide extra heat to obtain the desired substantially constant temperature at the measurement location of the temperature sensor, since this temperature is higher than the coil temperature. When the coils heat above the desired coil temperature, the temperature sensor may measure an increasing temperature at the measurement location. As a consequence, the temperature controller CN will provide a temperature control signal decreasing the amount of heat generated by the heater device HD, therewith maintaining the temperature at the measurement location at a substantially constant level.

Thus the steady-state temperature difference between coil temperature and the substantially constant temperature at the measurement location of the temperature sensor SE, creates a working range wherein the heater device HD can be used to quickly compensate a temperature rise of the coil by lowering the amount of heat generated by the heater device HD. Also, the heater device HD can be used to quickly compensate a temperature fall of the coil CL by increasing the amount of heat generated by the heater device HD.

Figure 4:
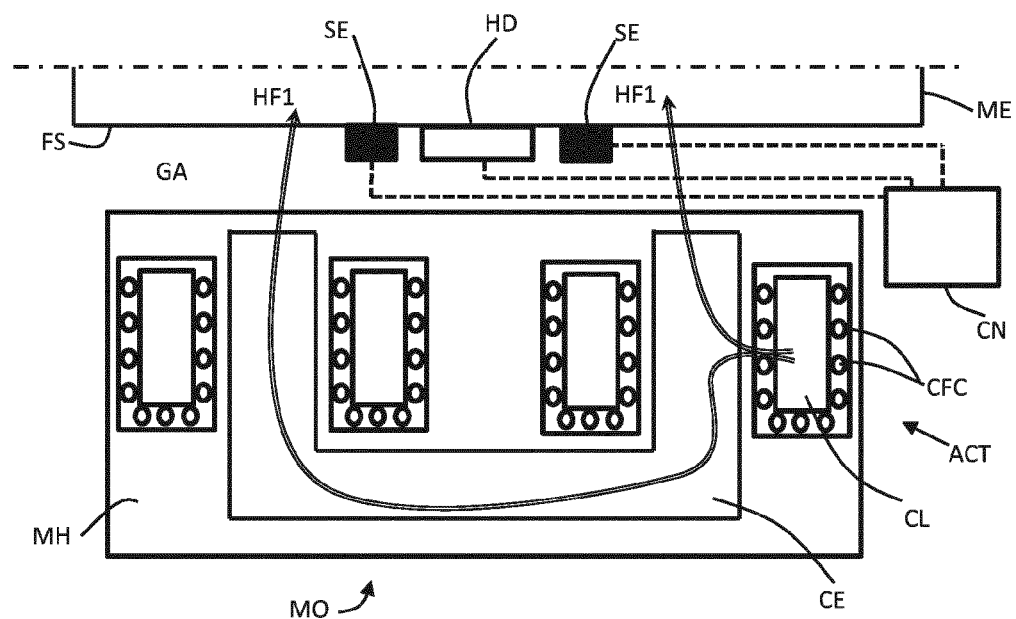
FIG. 4 depicts a side view of an actuator system according to a fourth embodiment of the invention.

FIG. 4 shows a fourth embodiment of an actuator system ACT. The same or substantially the same parts of the actuator system ACT are indicated by the same reference numerals.

In the embodiment of FIG. 4, two temperature sensors SE are provided on the facing surface FS of the mover element ME. A heater device HD, for example a heater film, is also provided on the facing surface FS.

When the coil CL heats with respect to the rest of the actuator system ACT, heat flux HF1 may flow through the dissipation paths indicated in the drawing towards the mover element ME. Heat may also flow directly from the coil CL towards the mover element, i.e. via the motor housing MH, instead of via the core element CE. These direct flows may also form heat dissipation paths from the coil CL to the mover element ME. However, the motor housing MH may be less heat conductive than the core element CE, and heat may more easily flow via the heat dissipation paths running through the core element CE.

This may result in an uneven temperature distribution over the surface of the motor housing MH facing towards the mover element ME. In particular, hot spots may occur at the locations of the surface close to the core element CE. The portions of the facing surface FS facing these locations are further referred to as facing surface portions FSP. Such uneven temperature distribution over the surface of the motor housing MH may also result in different levels of heat dissipation towards the mover element ME at different location on the facing surface FS.

In the embodiment of FIG. 4, the position of the measurement locations of the temperature sensors SE and the position of the heater device HD are selected such that when a substantially constant temperature is maintained at the measurement locations of the temperature sensors SE, the integral of heat dissipation over the cross section of the heat dissipation paths from the coils CL towards the mover element ME is substantially zero. How this works is further explained using FIG. 5.

Figure 5:
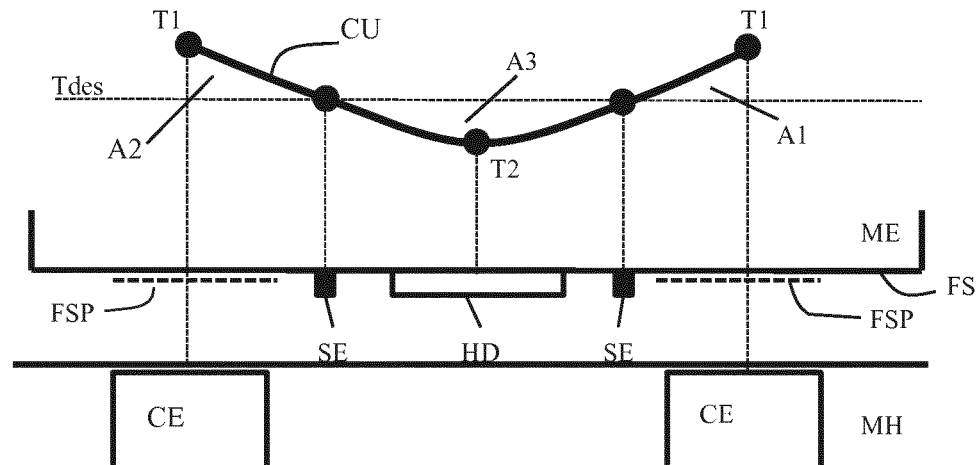
FIG. 5 depicts a close-up view of the actuator system of FIG. 4 and a temperature profile.

FIG. 5 shows a close-up view of FIG. 4. The mover element ME has two facing surface portions FSP. Since the facing surface portions FSP face the hotspots on the motor MO, the facing surface portions FSP have the highest temperature, T1. In this example, the hotspots are at the core elements CE. The heater device HD is on the facing surface FS between the two facing surface portions FSP. The temperature at the heater device HD is T2, which is lower than T1. There are two temperature sensors SE on the facing surface FS. Alternatively, one or more than two temperature sensors SE may be used. Each of the temperature sensors SE is between a facing surface portion FSP and the heater device HD. The desired temperature is set at Tdes. The heater device HD will start heating till the temperature sensors SE measure a temperature of Tdes, which is shown in FIG. 5. The temperature at location of the temperature sensor SE reaches Tdes before the temperature at the location of the heater device HD reaches the temperature of Tdes. The temperature at the locations of the facing surface portions FSP is higher than the temperature of Tdes. By selecting the position of the temperature sensors SE between the heater device HD and the facing surface portions FSP carefully, the average temperature of the mover element ME can be determined. Mathematically, it can be deducted that Tdes is the average temperature when the integral of the temperature profile curve CU is zero. The integral is zero when the areas A1 and A2 are equal to area A3. When the mover element ME is connected to the rest of the second body B2 via a suitable connection, for example mounted via the edges, the differences between T1, Tdes and T2 do not cause undesirable deformation of the second body B2.

In this embodiment, it is accepted that the levels of heat dissipation at different locations mover element ME may be different, but the total amount of heat dissipated towards the mover element ME is held at substantially the same level. For example, when due to heating of the coils CL the temperature of the facing surface portions FSP increases, the temperature sensors SE will measure an increasing temperature. In response, the temperature controller CN will decrease the amount of heat generated by the heater device HD. This results in an increased heat flux HF1 towards the mover element ME, but decreased further heat flux HF2 from the heater device HD to the mover element ME. As a consequence, a substantially constant heat dissipation to the mover element ME is maintained.

Figure 6:
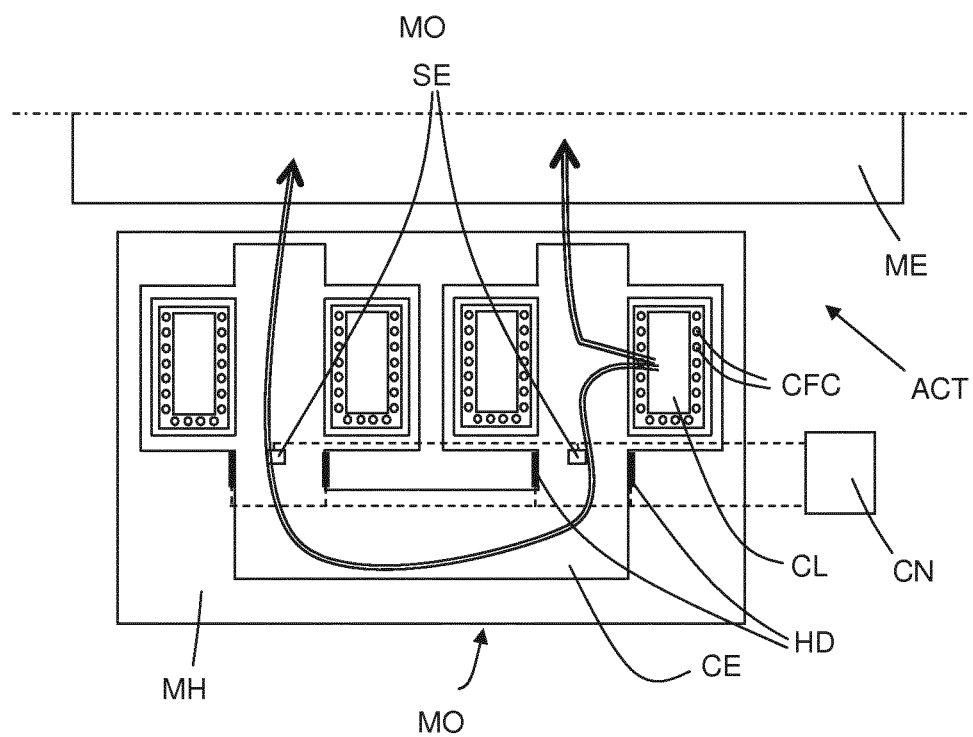
FIG. 6 depicts a side view of an actuator system according to a fifth embodiment of the invention.

FIG. 6 shows a fifth embodiment of an actuator system ACT. The same or substantially the same parts of the actuator system ACT are indicated by the same reference numerals.

In the embodiment of FIG. 6, the core element CE comprises a number of substantially closed spaces enclosing the coils CL of the motor. By enclosing the coils CL with the core element CE heat dissipation of the coils CL towards the mover element ME is further concentrated in the core element CE. Direct heat dissipation towards the mover element ME via a heat dissipation path not running via the core element CE may be avoided. By concentrating the heat dissipation of the coils CL towards the mover element ME in the core element CE, the heat dissipation may be controlled more accurately.

In alternative embodiments, other devices may be provided around the coils CL to concentrate the heat dissipation paths in the core elements. These other devices may be connected to the core element or the other devices may have very low thermal conductivity so that substantially all heat will be dissipated via the core element CE.

Alternative or in addition to the heater device HD and the temperature sensors SE described above, further temperature sensors SE may be arranged in the core elements CE and further heater devices HD may be arranged adjacent to the core element CE. The temperature control system is configured to maintain the temperature at the measurement locations of the temperature sensors SE substantially constant. Since the core element CE is made of a material with high thermal conductivity, maintaining a substantially constant temperature at the measurement locations also results in a substantially constant heat dissipation from the motor MO to the mover element ME.

In alternative embodiments, the temperature sensors SE and the heater device HD may be arranged at any other location in or adjacent to the core element CE, but it may be beneficial to arrange the one or more heater devices HD close to the coil CL.

Figure 7:
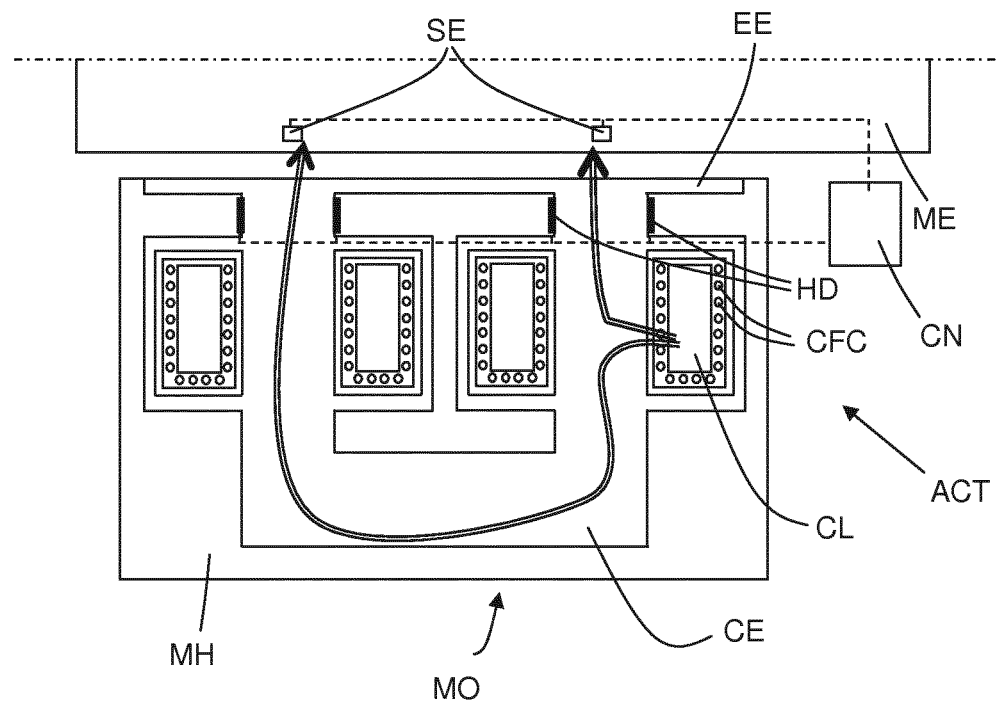
FIG. 7 depicts a side view of an actuator system according to a sixth embodiment of the invention.

FIG. 7 shows a sixth embodiment of an actuator system ACT. The same or substantially the same parts of the actuator system ACT are indicated by the same reference numerals.

In the embodiment of FIG. 7, temperature sensors SE are arranged in the mover element ME. This location of the temperature sensors SE may be beneficial to make compensation of the heat impact of Eddy currents on the mover element ME possible. Eddy currents may have a heat impact on the mover element ME. By measuring the temperature at measurement locations in the mover element ME this heat impact resulting from the Eddy currents can be taken into account during control of the heat dissipation of heat towards the mover element ME.

FIG. 7 shows heater devices HD on the core element CE. These heater device HD may be used alternatively or in addition to the heater device HD located on the mover element ME as mentioned in the embodiment above.

To improve the heat transfer between the core element CE and the mover element ME, the core element CE is provided with an end element EE having a large area and facing the mover element ME. In an embodiment, the gap between the mover element and the end element is small, for example at least 0.5 mm.

The temperature controller CN is configured to provide a temperature control signal to the heater devices HD on the basis of the temperature measured at the measurement locations of the temperature sensors SE. The temperature control signal is aimed at maintaining a substantially constant temperature at the measurement locations resulting in a constant heat dissipation towards the mover element ME including the thermal effect of Eddy currents on the temperature of the mover element ME.

As an alternative for temperature sensors on the mover element ME, the effect of Eddy current may also be compensated by using temperature sensors SE which are not mounted on the mover element ME, but are arranged to measure the temperature of the mover element ME. These temperature sensors SE may for instance be arranged on the surface of the motor housing MH facing towards the mover element, wherein an isolation layer is provided between the end element EE of the core element CE and the temperature sensor SE.

Hereinabove, the compensation of heat generated by a coil CL by a temperature control system is described for one coil. The same considerations also apply for the other coils CL shown in the drawings. The effects of all these coils CL may be compensated by the temperature control system as described.

Figure 8:
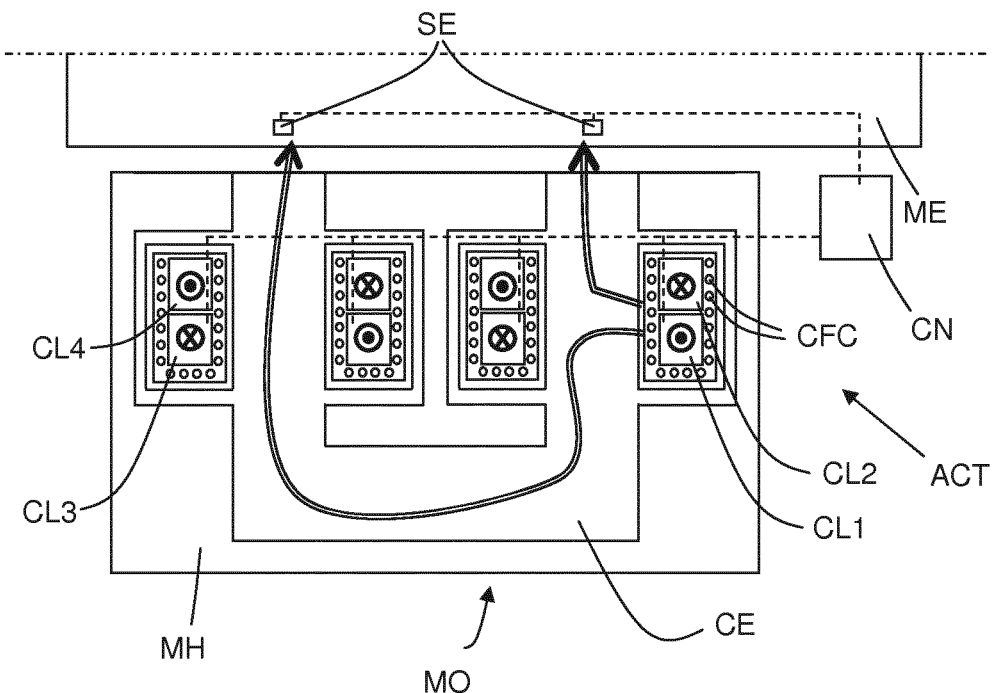
FIG. 8 depicts a side view of an actuator system according to a seventh embodiment of the invention.

FIG. 8 shows the seventh embodiment, which is similar to the embodiments described above, except that four coils, CL1-4, are provided arranged around one core element CE. The small circles in the figure show the direction of the electrical current through the coils. A circle with a black dot indicates the current flowing in a direction out of the paper, a circle with a cross indicates a direction into the paper. Coils CL1 and CL2 surround the right part of core element CE, coils CL3 and CL4 surround the left part. Current through a coil results in the creation of magnetic flux through the core element CE, and the direction of the current determines the direction of the flux. To obtain a maximum amount of magnetic flux, coils CL1 and CL2 may have a current in the same direction. To get maximum flux, coils CL3 and CL4 may have a current in a direction opposite to that of coils CL1 and CL2, so the flux through the core element CE is maximized.

In this embodiment, the actuator is provided with a coil CL1, and a further coil CL2. A controller (not shown) is provided to independently control the current through each of the coils. The controller is arranged to control the force created by the actuator by controlling the direction of the current through the coils, while keeping the amount of current constant. The amount of dissipated power is constant for different motor forces. In this embodiment, the further coil, or both coils together, function as a heater to obtain constant heat dissipation to the mover element ME. The actuator can create a motor force from 0 to a maximum force. The further coil may cancel at least partly the magnetic flux created by the coil. At zero force, the magnetic flux created by the coil is completely cancelled by the further coil. The currents may be as depicted in FIG. 8. At maximum force, the magnetic flux by both coils is added. As shown in FIG. 8, coils CL1 and CL2 may be adjacent and may be around a common core element CE. All four coils CL1-4 may be controlled independently by the controller.

The seventh embodiment may have the temperature control system as described in any of the embodiments above.

The invention is not limited to the embodiments described herein. Location of temperature sensors SE and heater devices HD may be varied in different embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising
a first body comprising a heat source;
a second body; and
a heater device;
wherein the second body has a facing surface facing the first body via a gap between the first and second bodies, wherein the heat source is for providing a heat flux to the second body via the gap, wherein the heater device is attached to the facing surface so that the heater device is arranged in the gap between the first and second bodies, and wherein the heater device is configured to provide a further heat flux to the second body.

2. The lithographic apparatus of claim 1, wherein the second body comprises an optical component.

3. The lithographic apparatus of claim 1, comprising an actuator having a mover and a coil for moving the mover relative to the coil, wherein the coil comprises the heat source, and wherein the second body comprises the mover.

4. The lithographic apparatus of claim 3, wherein the first body comprises a core element for supporting the coil, wherein the core element is arranged to transfer the heat flux from the heat source to the gap.

5. The lithographic apparatus of claim 4, wherein the core element enclosed the coil.

6. The lithographic apparatus of claim 4, wherein the core element has a surface facing the facing surface via the gap.

7. The lithographic apparatus of claim 6, comprising a temperature sensor for sending a signal based on a temperature of the second body, wherein the heater device is configured to provide the further heat flux based on the signal, wherein the facing surface has a facing surface portion, wherein the facing surface portion is facing the surface, wherein the temperature sensor is on the facing surface and is closer to the facing surface portion than the heater device is to the facing surface portion.

8. The lithographic apparatus of claim 3, comprising
a projection system for projecting a patterned radiation beam onto a target portion of a substrate; and
a substrate table for holding the substrate,
wherein the second body comprises the substrate table, and wherein the actuator is arranged to move the substrate table relative to the projection system.

9. The lithographic apparatus of claim 3, wherein the actuator is a reluctance motor.

10. The lithographic apparatus of claim 1, wherein the heater device comprises a heater film.

11. The lithographic apparatus of claim 1, wherein the heater device is configured to compensate a change in the heat flux from the heat source to the second body so that a total amount of heat flux to the second body from the heater device and the heat source is substantially constant.

12. The lithographic apparatus of claim 1, wherein an amount of power of the heater device is in the range of 1-10% of an amount of power of the heat source.

* * * * *